(12) United States Patent
Penanen

(10) Patent No.: US 7,323,869 B1
(45) Date of Patent: Jan. 29, 2008

(54) SUBRANGING SCHEME FOR SQUID SENSORS

(75) Inventor: Konstantin I. Penanen, Glendale, CA (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 0 days.

(21) Appl. No.: 11/279,137

(22) Filed: Apr. 10, 2006

(51) Int. Cl.
*G01R 33/02* (2006.01)

(52) U.S. Cl. ..................................... 324/248
(58) Field of Classification Search .............. 324/248, 324/225, 244
See application file for complete search history.

(56) References Cited

U.S. PATENT DOCUMENTS

| | | | |
|---|---|---|---|
| 5,141,334 A | 8/1992 | Castles | |
| 5,469,057 A * | 11/1995 | Robinson | 324/248 |
| 6,339,328 B1 * | 1/2002 | Keene et al. | 324/248 |
| 6,377,110 B1 | 4/2002 | Cooper | |
| 6,556,153 B1 | 4/2003 | Cardamone | |
| 2002/0060635 A1 | 5/2002 | Gupta et al. | |

OTHER PUBLICATIONS

H. Myoren, et al., "Double Relaxation Oscillation SQUID with 4JL On-Chip Digital Flux Locked-Loop Circuit", AIST (2004).

* cited by examiner

*Primary Examiner*—Reena Aurora
(74) *Attorney, Agent, or Firm*—Mark Homer

(57) ABSTRACT

A readout scheme for measuring the output from a SQUID-based sensor-array using an improved subranging architecture that includes multiple resolution channels (such as a coarse resolution channel and a fine resolution channel). The scheme employs a flux sensing circuit with a sensing coil connected in series to multiple input coils, each input coil being coupled to a corresponding SQUID detection circuit having a high-resolution SQUID device with independent linearizing feedback. A two-resolution configuration (course and fine) is illustrated with a primary SQUID detection circuit for generating a fine readout, and a secondary SQUID detection circuit for generating a course readout, both having feedback current coupled to the respective SQUID devices via feedback/modulation coils. The primary and secondary SQUID detection circuits function and derive independent feedback. Thus, the SQUID devices may be monitored independently of each other (and read simultaneously) to dramatically increase slew rates and dynamic range.

19 Claims, 3 Drawing Sheets

SUBRANGING SCHEME FOR SQUID SENSORS

STATEMENT OF GOVERNMENT INTEREST

The invention described hereunder was made in the performance of work under a NASA contract, and is subject to the provisions of Public Law #96-517 (35 U.S.C. 202) in which the Contractor has elected not to retain title.

BACKGROUND a. Field of Invention

The invention relates to Superconducting Quantum Interference Device (SQUID) and, more particularly, to a method and apparatus for quantifying the output of a SQUID sensor by subranging.

b. Background of the Invention

The Josephson Effect, a quantum phenomenon, was largely formulated by the Nobel Prize Laureates Brian D. Josephson and Philip W. Anderson. The Josephson Effect entails a flow of electric current as electron pairs, called Cooper pairs, between two superconducting materials that are separated by an extremely thin insulator. This arrangement is called a Josephson junction. This phenomenon in superconductors is the basis of the Superconducting Quantum Interference Device (SQUID). SQUIDS are highly sensitive magnetic flux detectors that can be used for measuring temperature, displacement, magnetic fields, etc. Indeed, they are the most sensitive detectors of magnetic flux currently known. The DC superconducting quantum interference device (SQUID) consists of two superconductors separated by thin insulating layers to form two parallel Josephson junctions (another implementation, the RF SQUID, requires only a single junction). The device may be configured as a magnetometer to detect incredibly small magnetic fields—small enough to measure the magnetic fields in living organisms. Alternatively, SQUID devices can be adapted to measure temperature, displacement, etc. Despite the existing sensitivity of these devices, there is room for improvement.

For example, the potential for even more sensitive measurements of displacement has profound implications for several high-impact gravitational physics and particle physics projects in space. Example applications include the detection of gravitational waves, the test of the equivalence principle, the search for the postulated "axion" particle, and the test of the inverse square law of gravity, all of which rely on the detection of small displacements. If the displacement sensor is sensitive enough to observe the quantum mechanical zero-point motion of a test mass, it will be possible to make a direct examination of the Heisenberg uncertainty principle.

SQUID temperature sensors generally comprise a coil wound on a core made of a material which has a temperature-dependent magnetic susceptibility in the temperature range of interest. The core and the coil are placed in a DC magnetic field provided either by a permanent magnet or by a flux trapped inside a superconducting outer wall. The coil is connected to an input coil of a SQUID. Changing temperature leads to changes in susceptibility of the core and to changes in the magnetic flux detected by the SQUID, which is capable of detecting small magnetic flux changes.

FIG. 1 illustrates a generic SQUID system employing a flux pickup coil 12 coupled to an inductive input coil 14. The flux pickup coil 12 detects directly-applied flux and couples currents into the input coil 14. In practice, the flux pickup coil 12 is typically wrapped around a paramagnetic salt pill. The salt pill is thermally linked to a sample of interest for indirect thermal measurement of the sample via measurement of the magnetic susceptibility of the paramagnetic salt. The coupled currents generate flux that couples into the SQUID loop 20 for detection. See, for example, "Absolute Temperature Measurement", IBM Technical Disclosure Bulletin, April 1989, vol. 31, No. 11, pp. 396-397 TBD-ACC-No.:NN8904396.

Using SQUIDs, researchers have made the most sensitive measurements of magnetic field, temperature, displacement and pressure. There are a variety of digital readout schemes for measuring the output from SQUID-based single sensors and sensor-arrays. The response of a SQUID device to the enclosed magnetic flux is a periodic function of the flux. A common implementation of a SQUID sensor readout uses feedback to inject additional magnetic flux into the sense loop of the SQUID device to maintain the total flux in the loop constant. The SQUID controller output is then proportional to this injected additional flux. When the input signal causes the limit of the feedback current to be exceeded, the controller is "reset". The magnitudes of the magnetic fluxes before and after the reset differ by an integer multiple of a fundamental unit. $\Phi_n$=h/2e. Thus, flux can be measured across a wide dynamic range by keeping track of these flux resets via a hardware or software counter.

A more detailed diagram of a digital SQUID is shown in FIG. 2. The magnetic flux in SQUID 12 causes a voltage (V) to appear across it. Measurement of the characteristics of a signal current can be made by measuring the magnetic flux it produces in a pick-up coil 10. The analog SQUID 12 senses pick-up coil 10, and provides an output that is coupled to a clocked and gated comparator 18. The comparator 18 digital output provides both the desired flux measurement as well as linearizing feedback that is coupled back to the pick-up coil 10.

Rather than a hardware counter (clocked and gated comparator) as above, some applications employ a software counter. While adequate for some applications, these existing SQUID digital hardware/software counters suffer from a few drawbacks. If the temperature is changed rapidly, or the temperature noise is high, the counter hardware/software tends to lose flux count. With a software counter, the temperature reading is lost entirely if the software is reset/restarted. A multiplexed SQUID controller aggravates the problem, as the flux reading is performed less frequently.

A few different approaches have been attempted to correct this. One such attempt attaches binary carry lookahead (BCL) circuits attached to the counted for higher-speed operation to adapt to rapid temperature fluctuations. See, Double Relaxation Oscillation SQUID with a 4JL On-Chip Digital Flux Locked-Loop Circuit, H. Myoren, M. Goto, T. Taino, S. Takada, Saitama Univ.; K. Kikuchi, H. Nakagawa, K. Tokoro, M. Aoyagi, AIST Another promising technique is digital subranging. Subranging has been applied in other contexts. For example, U.S. Pat. No. 6,556,153 to Cardamone issued Apr. 29, 2003 shows a system and method for improving encoder resolution using software. Dual measurements are taken: 1) a table is populated with position information based on a sample of the signals from a position sensing device, such as to provide the position information for the table; and 2) an indication of position is determined as a function of velocity and time.

U.S. Pat. No. 6,377,110 to Cooper (Keystone Thermometrics) issued Apr. 23, 2002 shows a low-cost temperature sensor circuit for silicon thermometry that possesses a high degree of linearity and a wide dynamic range. The circuit uses a mixed-signal approach in which zero offset and desired output voltage are set, independently of each other. Slope (span) is set at a full scale temperature different from the first temperature.

Subranging has only recently been attempted in SQUID sensor arrays to produce different "course" and "fine" outputs. This improves the dynamic range as well as the speed or "slew rate" of the output circuitry (dynamic range is the ratio of the maximum signal that can be measured to that of the minimum signal that can be measured, the slew rate is the time rate of change of signals).

U.S. patent application Ser. No. 20020060635 by Gupta, published May 23, 2002, which discloses a subranging architecture using digital SQUID technology to design systems with larger dynamic range, higher resolution and larger bandwidth than existing systems. As shown in FIG. 3, the architecture uses a first SQUID device SQ1 coupled to a first inductive section, and a second SQUID device SQ2 coupled to a second inductive section. The first SQUID is designed to produce "coarse" (large amplitude, low resolution) output signals and the second SQUID is designed to produce "fine" (low amplitude, high resolution) output signals in response to the analog input signals. The output signals of the first SQUID SQ1 are coupled to a first comparator 101 having an output for producing a first quantized output signal which is coupled back to the input coil L1. The output signals of the second SQUID SQ2 are coupled to a second comparator 12 having an output for producing a second quantized output signal which is also coupled back to the input coil. The first and second inductive sections L1, L2 are connected in series or in parallel, the inductance of the second inductive section L2 being greater than the inductance of the first inductive section L1 for causing the first SQUID SQ1 and the first comparator L1 to produce a "coarse" ouput and the second SQUID SQ2 and the second comparator L2 to produce a "fine" output. The coarse resolution SQUID SQ1 is first used to cancel the flux in the pick-up loop until the amplitude of the input signal is below a "coarse" resolution step. Then, the fine resolution SQUID SQ2 takes over when the flux in the pick-up loop is smaller than the resolution of the coarse SQUID SQ1. The subranging scheme proposed by the Gupta '635 application essentially uses digitized feedback to "null" the flux through the pick-up loop l.p. This "nulling" is accomplished by sequentially introducing fluxons by superconducting "gates". Unfortunately, as described more fully (below) this still limits both slew rates and dynamic range.

It would be far more advantageous to provide a subranging scheme that leaves linearizing feedback with the individual SQUID sensors rather than introducing feedback current into the input coil. This would allow the readout of individual SQUID sensors to be done simultaneously, not sequentially, thereby increasing slew rates and dynamic range.

SUMMARY OF THE INVENTION

It is, therefore, an object of the present invention to provide a method an apparatus for quantifying the output of a SQUID sensor by subranging using multiple-resolution channels each employing a separate SQUID device designed to function and be monitored independently, and wherein linearizing feedback is coupled independently into the individual SQUID devices.

It is another object to provide a readout scheme for measuring the output from a SQUID-based sensor-array using an improved subranging architecture that improves speed, dynamic range and resolution.

It is still another object to provide a readout scheme for measuring the output from a thermometric SQUID-based sensor-array using a coarse resolution channel and a fine resolution channel each employing a high-resolution SQUID device having independent linearizing feedback coupled directly thereto rather than to the sensing/input coils, thereby allowing simultaneous readout of the individual course/fine SQUID sensors, not one-by-one as in the prior art, to increasing slew rates and dynamic range.

According to the present invention, the above-described and other objects are accomplished by providing a readout scheme for measuring the output from a SQUID-based sensor-array using an improved subranging architecture that improves speed and resolution. The subranging architecture includes multiple resolution channels (e.g., a coarse resolution channel and a fine resolution channel). The flux sensing circuit includes a sensing coil connected in series to multiple input coils, each input coil being coupled to a corresponding SQUID detection circuits having a high-resolution SQUID device with independent linearizing feedback. The preferred embodiment employs a two-resolution configuration (course and fine) with a primary SQUID detection circuit including a first SQUID device coupled to a primary input coil of the flux sensing circuit for generating a fine readout, and a first feedback coil coupled directly back to the primary SQUID device. A secondary SQUID detection circuit includes a second SQUID device coupled to the secondary input coil of the flux sensing circuit for generating a course readout, and a second feedback coil coupled directly back to the secondary SQUID device. The primary and secondary SQUID detection circuits function and derive independent feedback (linearizing feedback is coupled independently into the individual SQUID devices rather than the input coils). Thus, the SQUID devices may be monitored independently of each other (and read simultaneously) to dramatically increase slew rates and dynamic range.

DETAILED DESCRIPTION OF THE PREFERRED EMBODIMENT

The present invention is a readout scheme for measuring the output from a SQUID-based sensor-array using an improved subranging architecture that improves speed and resolution. The subranging architecture includes a coarse resolution channel and a fine resolution channel using a wide dynamic range and two or more high-resolution SQUIDs. The coarse and the fine resolution channels are designed to function (and be monitored) independently, and linearizing feedback is coupled independently into the individual SQUID sensors rather than the input coils. This allow the simultaneous readout of individual SQUID sensors, not one-by-one as in the prior art, thereby increasing slew rates and dynamic range.

Figure 1:
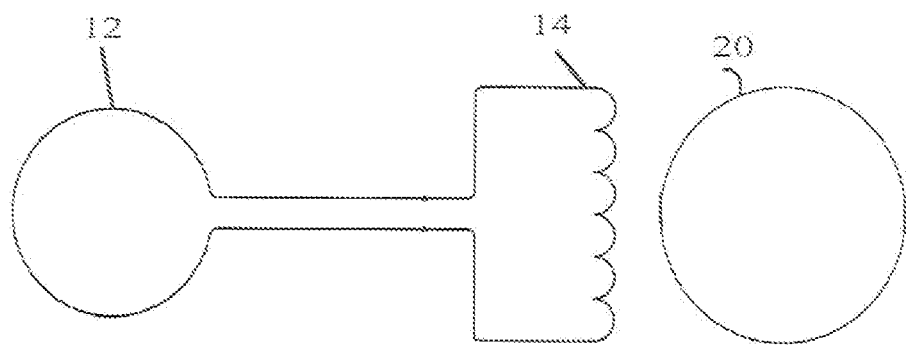
FIG. 1 illustrates a typical (Prior Art) SQUID system employing a flux pickup coil 12 coupled to an inductive input coil 14.
Figure 2:
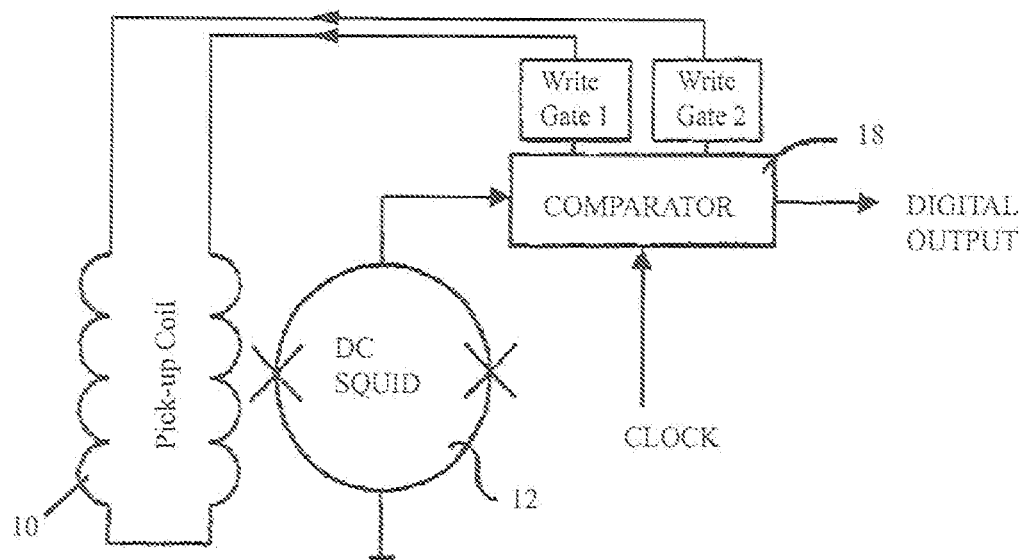
FIG. 2 is a typical (Prior Art) digital readout schemes for measuring the output from a SQUID-based sensor-array as in FIG. 1.
Figure 3:
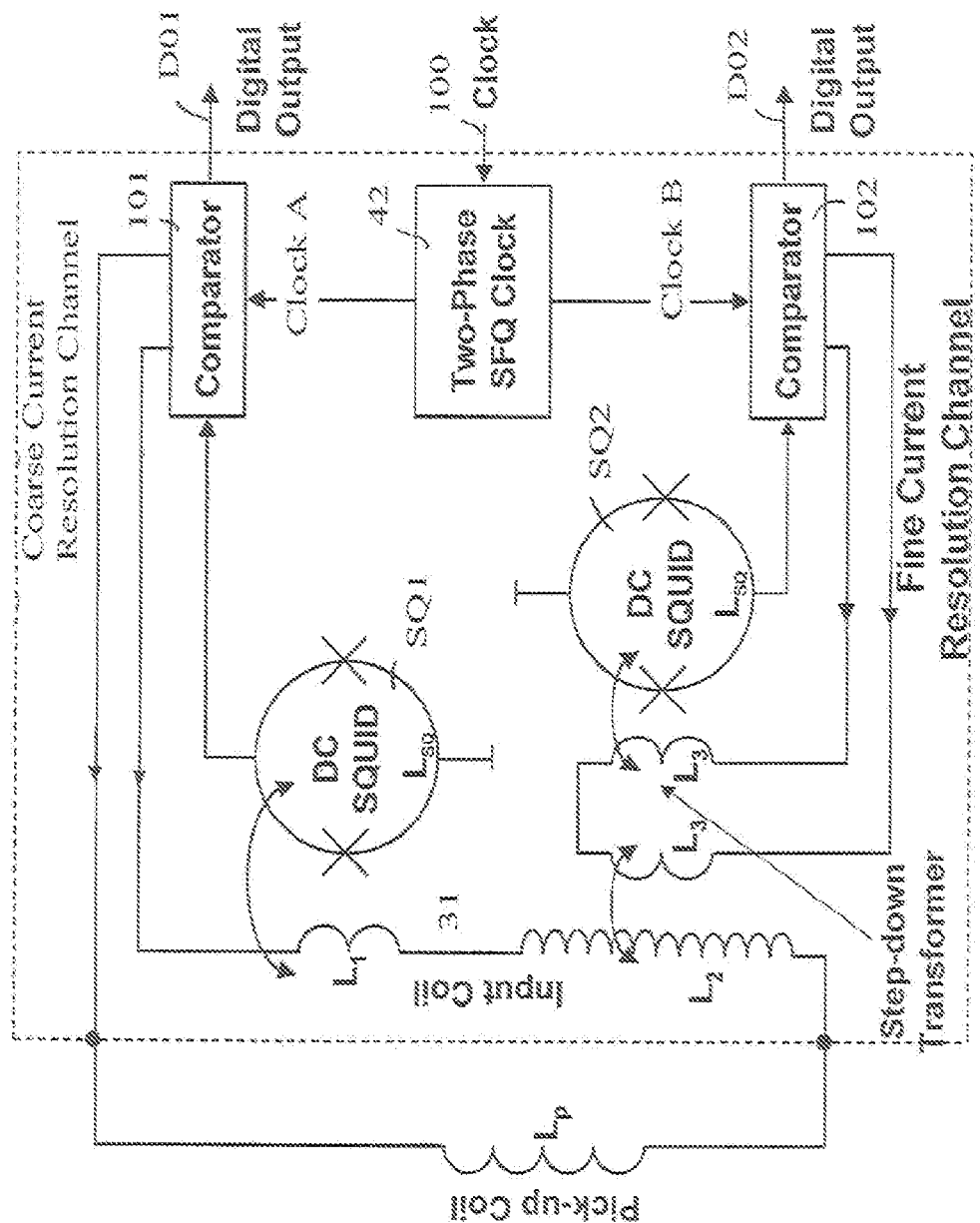
FIG. 3 is a block diagram of a prior art readout scheme for measuring the output from a SQUID-based sensor-array using a subranging architecture.
Figure 4:
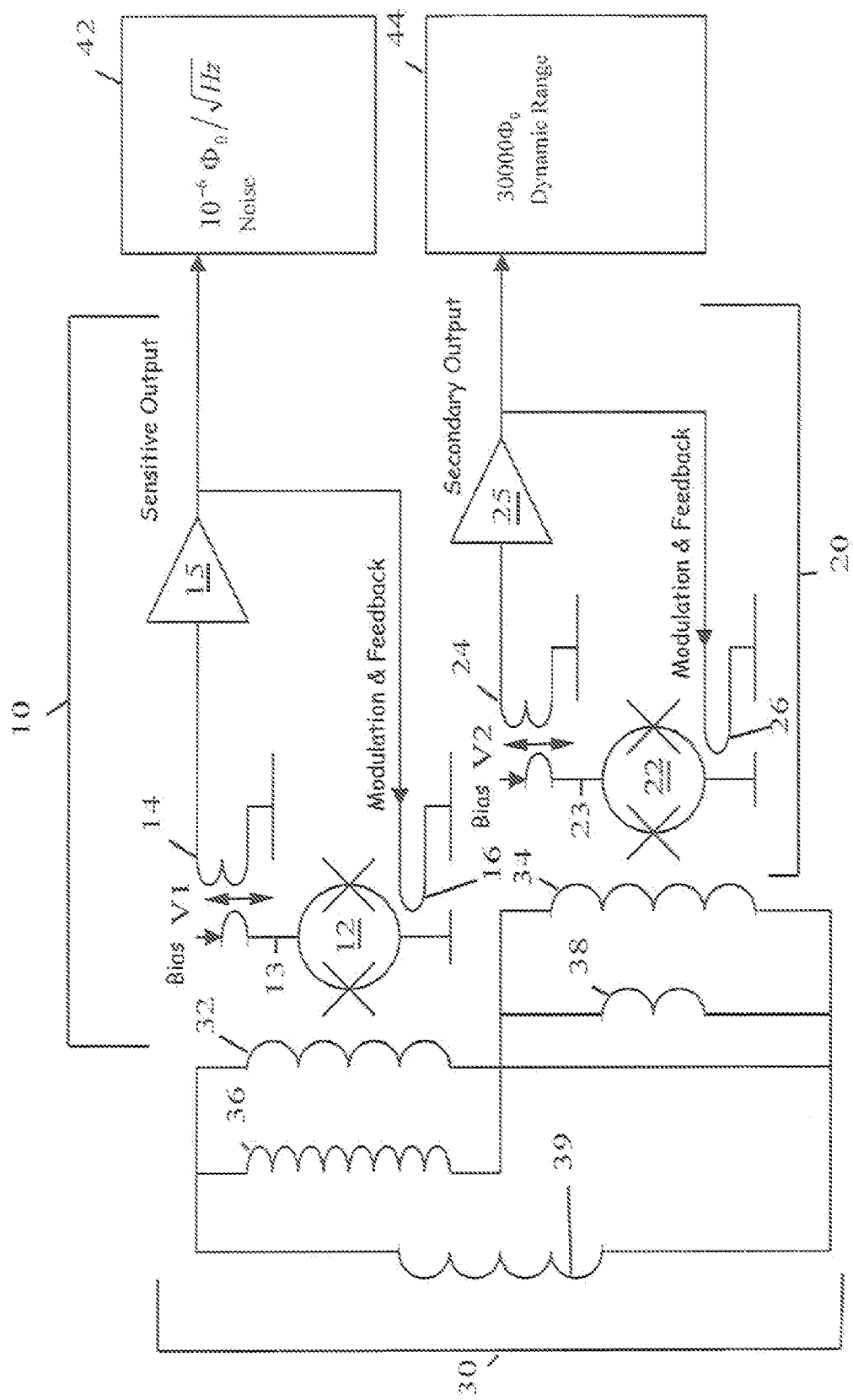
FIG. 4 is a block diagram of a readout scheme for measuring the output from a SQUID-based sensor-array using an improved subranging architecture according to the present invention.

FIG. 4 is a block diagram of a readout scheme for measuring the output from a SQUID-based sensor-array using an improved subranging according to the present invention.

In accordance with the present invention, a split or "branched" flux sensing circuit 30 (to be described) detects directly-applied flux and couples currents to at least two branched SQUID detection circuits 10 and 20. The illustrated embodiment employs two SQUID detection circuits 10 and 20 which are sufficient for most thermometric applications, one SQUID detection circuit 10 being designated as the primary and the other 20 as the secondary. The secondary SQUID detection circuit 20 generates a course readout that registers a small fraction of the magnetic flux passing through the primary or fine SQUID detection circuit 20.

One skilled in the art will understand that additional SQUID detection circuits may be cascaded if desired. Each SQUID detection circuit 10, 20 comprises a SQUID device 12, 22 SQUID devices 12, 22 may be conventional superconducting materials that are voltage biased, meaning that the current through the devices 12, 22 are controlled by varying the voltage on electrodes 13, 23. In FIG. 4 the symbol "X" identifies the presence of a Josephson junction. The voltage level of electrodes 13, 23 determines whether any current flows, or whether quasi-particle or Cooper pairs flow. Thus, measurement of the desired flux characteristics can be made by measuring the magnetic flux produced in sensing circuit 30, which is in turn detected by SQUIDs 12, 22.

Sensing circuit 30 comprises a primary SQUID input coil 32 (dedicated to primary SQUID 12) connected in series with a secondary SQUID input coil 34 (dedicated to secondary SQUID 22). Primary SQUID input coil 32 is connected in parallel to a large inductor 36, and secondary SQUID input coil 34 is connected in parallel to a smaller inductor or "shunt coil" 38. All of the above-described coils 32-38 are connected in series with the sense coil 39, which in practice will be wrapped around the paramagnetic salt material (thermally linked to a sample) as described above. In accordance with the present invention, the primary SQUID input coil 32 incorporates a greater number of windings relative to secondary SQUID input coil 34, the secondary SQUID input coil 34 being branched in series with the larger primary SQUID input coil 32. Likewise, the large inductor 36 which is parallel to the primary SQUID input coil 32 incorporates a greater number of windings relative to the shunt coil 38 which is parallel to the secondary SQUID input coil 34. Thus, the subranging architecture combines a secondary (coarse) and a primary (fine) resolution channel by differentially shunting the input coils and by placing shunted secondary SQUID input coil 34 in series with the larger shunted primary SQUID input coil 32. This likewise couples a fine flux into primary SQUID detection circuit 10, and a course flux into the secondary SQUID detection circuit 20 (the course flux being a small fraction of the magnetic flux passing through the primary or fine SQUID detection circuit 20).

One skilled in the art will understand that the same secondary (coarse) and primary (fine) resolution channels can be implemented other than by differentially shunting the input coils as above. For example, both the shunts 36, 38 and sense coil 39 can be eliminated by directly winding the primary SQUID input coil 32 around the paramagnetic salt material, and by winding the secondary SQUID input coil 34 around the same salt pill with fewer windings. Alternatively, just the shunts 36, 38 can be eliminated (keeping sense coil 39) by use of a primary SQUID input coil 32 having a greater number of windings relative to the secondary SQUID input coil 34.

In all such configurations, the magnetic flux in SQUIDs 12, 22 causes a change in response of SQUID output signal (V1 & V2) to the applied modulation. The SQUID voltage out coils 14, 24 is pre-amplified by any suitable pre-amplifiers 15, 25 in a known manner, and a suitable feedback current is injected into the feedback/modulation coils 16, 26 to counteract such a change in response. A very precise measurement of magnetic flux ($\Phi$) can be performed by the branched sub-ranging configuration as shown, the secondary SQUID detection circuit 20 measuring coarse resolution, e.g., measuring the current in larger steps leaving a smaller current, less than its step size (resolution), to be measured by the primary SQUID detection circuit 10.

SQUIDs 12, 22 are non-linear devices with a periodic transfer characteristic. To increase the dynamic range of SQUID, the transfer function must be linearized using feedback. The conventional method of achieving this is to magnetically couple the SQUID outputs back into the input coils (or sensing circuitry). In accordance with the present invention 30, feedback is derived from the two SQUID voltage out coils 14, 24 and is coupled direction back to the respective SQUID devices 12, 22. The feedback/modulation coils 16, 26 each carry a current proportional to the change in flux coupled from SQUID input coils 32 and 34, and couple directly to the SQUIDs 12,22. These feedback loops can be implemented as integrated on-chip circuitry or through external, room temperature electronics. The SQUIDs 12, 22 are preferably biased in the center of the liner region of their V($\Phi$) curves. Thus, as the externally applied flux ($\Phi$) increases, the voltage (V) across the respective SQUID 12, 22 also increases, resulting in a proportional increase in the feedback current 11, 12. The feedback currents 11, 12 are fed back to feedback/modulation coils 16, 26 which produce magnetic flux, equal and opposite to the input flux, in the respective SQUIDs 12, 22. This configuration is quite different from digital feedback, which is known. For example, in the Gupta reference (cited previously) the analog dc SQUID is magnetically coupled to a clocked comparator circuit, which produces digital feedback in the form of single flux quanta (SFQ) injected directly into the pick-up coil loop. This digitized feedback depends on the speed of the digital circuitry which operates sequentially, thereby resulting in relatively slow (clock-limited) slew rates. The proposed scheme does not rely on the quantum accuracy of the SQUID feedback electronics. Analog feedback circuitry commonly used in DC SQUID controller designs is sufficient, and does not introduce errors or noise in the readouts. Alternatively, digital feedback may be derived from the DACS 42, 44 if desired, and fed back to feedback/modulation coils 16, 26 via conventional digital-to-analog conversion (as mentioned in the Gupta reference). Either way, direct feedback offers a substantial improvement in resolution over what is currently possible.

In accordance with the present invention, the linearizing feedback is produced by the individual SQUIDs 12, 22 and is fed directly back to the respective SQUIDs 12, 22 via feedback/modulation coils 16, 26, rather than introducing feedback current into the input coils of sensing circuit 30. This direct analog feedback allows the readout of the individual SQUID sensors 12, 22 to be done simultaneously, not sequentially, and without reliance on clocked digital circuitry, thereby drastically increasing slew rates.

As illustrated, both SQUIDs 12, 22 are preferably monitored digitally via digital-to-analog converters (DACs), the sensitive output of primary SQUID 12 being monitored by DAC 42, and the course output of secondary SQUID 22 being monitored by DAC 44. Both DACS 42, 44 may be conventional high-speed 16-bit digital-to-analog converters. If the secondary SQUID 22 readout is monitored by 16-bit DAC 42 and the digitizing determines the readout accuracy, the dynamic range of the described scheme is optimized by selecting the secondary SQUID 22 readout to be −32000 less sensitive than the primary SQUID 12 readout. In a typical temperature-sensing application this will correspond to a temperature range of approximately −3 mK. In this temperature range there is no need to actively keep track of the flux state and still maintain the readout fidelity. The goal is to avoid having to reset the secondary DAC 44 as it slews through the temperature range of interest, while maintaining the capability of determining the flux state of the primary SQUID 12 via DAC 42 unambiguously. Since feedback to the two SQUIDs 12, 22 is independent, and since the two DACS 42, 44 monitor the outputs independently, the goal is accomplished. The noise function shown in DAC 42 indicates that the system is as sensitive as a single SQUID arrangement would be (where the noise is limited by the fundamental thermal or Johnson noise of the SQUID itself, and not by the readout electronics). At the same time, the dynamic range is enhanced to 30000 Φ, by the use of the secondary DAC 44 readout. The above-described scheme may be contrasted to the Gupta reference, wherein the two coarse and fine channels are alternately clocked; i.e., first one and then the other, and the outputs must be added. In the current configuration the digital outputs from the two DACs 42, 44 can be read independently and simultaneously, and can then be combined off chip or on instantaneously, not one-by-one as in the prior art, thereby increasing slew rates.

The entire above-described circuit can be embodied in a single microchip, including SQUIDs 12, 22 and DACS 42, 44 with two different current resolutions, two independent feedback loops, all coupled to sensing circuit 30, and conventional DAC counting hardware. Other advantages of the proposed design include persistency of current in the sensing circuit 30. Since the current in the input coils is preserved, the measurement of the flux (or current) remains repeatable because the feedback circuits are not in persistent mode (as long as the input does not change in excess of the dynamic range of the least sensitive cascade. In addition, full bandwidth of the individual DC SQUID sensors is preserved.

To avoid the need for DAC counting hardware altogether, a tertiary readout can be added (effectively giving a direct course or primary readout and a direct fine or tertiary readout. The raw reconstructed course and fine readouts must be combined visually to produce the complete dynamic range of the signal. In other words, the total range would be the sum of the ranges of the two readouts. With a cascaded tertiary readout, the temperature range would exceed several degrees Kelvin (3 mK*32000). This range would comfortably exceed the working range of both the paramagnetic material and the superconducting pick-up coil. This implementation can be extended inasmuch as certain applications may require three, four or more-range configurations as a matter of design choice to cover larger dynamic ranges. The proposed sub-ranging technique is easily sealable simply by cascading additional branches (i.e., more than just coarse and fine), and any number of branches is considered to be within the scope and spirit of the present invention. In all such case the proposed scheme enables unambiguous readout of the flux of a SQUID magnetometer in a wide dynamic range while maintaining its superior flux sensitivity. The proposed scheme has broad application in the fields of HRT temperature control of multiplexed SQUID-based bolometer sensor arrays, as well as other SQUID based applications.

Having now fully set forth the preferred embodiment and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth herein.

I claim:

1. A subranging SQUID-based sensor-array, comprising:
a flux sensing circuit including a sensing coil connected in series to a primary input coil and a secondary input coil;
a primary SQUID detection circuit including a first SQUID device coupled to the primary input coil of said flux sensing circuit for generating a fine readout, and a first feedback coil coupled directly back to the primary SQUID device;
a secondary SQUID detection circuit including a second SQUID device coupled to the secondary input coil of said flux sensing circuit for generating a course readout, and a second feedback coil coupled directly back to the secondary SQUID;
whereby the primary and secondary SQUID detection circuits independently function and derive independent feedback, and may therefore be monitored independently of each other to increase slew rates and dynamic range.

2. The subranging SQUID-based sensor-array according to claim 1, further comprising a first inductor connected in parallel across said primary input coil and a second inductor connected in parallel across said secondary input coil.

3. The subranging SQUID-based sensor-array according to claim 2, wherein said first inductor has a larger inductance than said second inductor.

4. The subranging SQUID-based sensor-array according to claim 1, wherein said primary SQUID detection circuit further comprises a first amplifier connected between said first feedback coil and first modulation coil.

5. The subranging SQUID-based sensor-array according to claim 4, wherein said secondary SQUID detection circuit further comprises a second amplifier connected between said second feedback coil and second modulation coil.

6. The subranging SQUID-based sensor-array according to claim 4, further comprising a first analog-to-digital converter connected to a junction of said first amplifier and said first modulation coil.

7. The subranging SQUID-based sensor-array according to claim 6, further comprising a second analog-to-digital converter connected to a junction of said second amplifier and said second modulation coil.

8. A subranging SQUID-based sensor-array, comprising:
a flux sensing circuit including a sensing coil connected in series to a plurality of input coils;
a corresponding plurality of SQUID detection circuits each including a SQUID device coupled to one of said input coils of said flux sensing circuit for generating a readout, and a feedback coil coupled directly back to the respective SQUID device via a modulation coil;
whereby the plurality of SQUID detection circuits each function to provide a subranged output with independent linearizing feedback, and may therefore be monitored independently of each other to increase slew rates and dynamic range.

9. The subranging SQUID-based sensor-array according to claim 8, further comprising a plurality of inductors each connected in parallel across a corresponding one of said input coils.

10. The subranging SQUID-based sensor-array according to claim 9, wherein each of said inductors have a different inductance.

11. The subranging SQUID-based sensor-array according to claim 8, wherein each of said SQUID detection circuits further comprises an amplifier connected between the respective feedback coil and modulation coil.

12. The subranging SQUID-based sensor-array according to claim 11, further comprising a plurality of analog-to-digital converters each connected to a junction of one of said amplifiers and corresponding modulation coils.

13. A subranging SQUID-based sensor-array, comprising:
  a flux sensing circuit including a primary input coil and a secondary input coil having a smaller effective inductance than said primary input coil;
  a primary SQUID detection circuit including a first SQUID device coupled to the primary input coil of said flux, sensing circuit for generating a fine readout, and a first feedback coil coupled directly back to the primary SQUID device via a first modulation coil;
  a secondary SQUID detection circuit including a second SQUID device coupled to the secondary input coil of said flux sensing circuit for generating a course readout, and a second feedback coil coupled directly back to the secondary SQUID device via a second modulation coil;
  whereby the primary and secondary SQUID detection circuits independently function and derive independent feedback, and may therefore be monitored independently of each other to increase slew rates and dynamic range.

14. The subranging SQUID-based sensor-array according to claim 13, wherein the smaller effective inductance of the primary input coil is achieved with a first inductor connected in parallel across said primary input coil and a second inductor connected in parallel across said secondary input coil.

15. The subranging SQUID-based sensor-array according to claim 14, wherein said first inductor has a larger inductance than said second inductor.

16. The subranging SQUID-based sensor-array according to claim 15, wherein said primary SQUID detection circuit further comprises a first amplifier connected between said first feedback coil and first modulation coil.

17. The subranging SQUID-based sensor-array according to claim 16, wherein said secondary SQUID detection circuit further comprises a second amplifier connected between said second feedback coil and second modulation coil.

18. The subranging SQUID-based sensor-array according to claim 17, further comprising a first analog-to-digital converter connected to a junction of said first amplifier and said first modulation coil.

19. The subranging SQUID-based sensor-array according to claim 18, further comprising a second analog-to-digital converter connected to a junction of said second amplifier and said second modulation coil.

* * * * *